(12) United States Patent
Hashimoto

(10) Patent No.: US 6,169,393 B1
(45) Date of Patent: Jan. 2, 2001

(54) TRIMMING CIRCUIT

(75) Inventor: Yasuhiro Hashimoto, Kasugai (JP)

(73) Assignee: Fujitsu Limited, Kawasaki (JP)

(*) Notice: Under 35 U.S.C. 154(b), the term of this patent shall be extended for 0 days.

(21) Appl. No.: 09/559,100

(22) Filed: Apr. 27, 2000

(30) Foreign Application Priority Data

May 28, 1999 (JP) ............................................. 11-149822

(51) Int. Cl.$^7$ ...................................................... H02J 3/12
(52) U.S. Cl. ............................................................. 323/354
(58) Field of Search .................................... 323/352, 353, 323/354

(56) References Cited

U.S. PATENT DOCUMENTS

| | | | |
|---|---|---|---|
| 4,338,590 | * 7/1982 | Connolly, Jr. et al. | 341/121 |
| 4,412,241 | * 10/1983 | Nelson | 257/529 |
| 4,665,356 | * 5/1987 | Pease | 323/314 |
| 4,730,129 | * 3/1988 | Kunitoki et al. | 327/525 |
| 5,047,664 | * 9/1991 | Moyal | 327/566 |
| 5,361,001 | * 11/1994 | Stolfa | 327/530 |
| 5,446,407 | * 8/1995 | Yamamoto | 327/525 |
| 5,514,948 | * 5/1996 | Okazaki | 323/314 |
| 5,982,163 | * 11/1999 | Shinozaki | 323/354 |
| 6,002,261 | * 12/1999 | Goldman | 324/550 |
| 6,011,425 | * 1/2000 | Oh et al. | 327/525 |

FOREIGN PATENT DOCUMENTS

| | | |
|---|---|---|
| 3-4187 | 1/1991 | (JP) . |
| 7-141041 | 6/1995 | (JP) . |

* cited by examiner

*Primary Examiner*—Adolf Deneke Berhane
(74) *Attorney, Agent, or Firm*—Arent Fox Kintner Plotkin & Kahn, PLLC

(57) ABSTRACT

A trimming circuit for a semiconductor device performs both simulated fuse breakage and actual fuse breakage by selectively short-circuiting an adjusted device. The trimming circuit includes a switch connected in parallel with the adjusted device. Activating the switch causes the adjusted device to be by-passed or short-circuited. A first external terminal is connected to the switch to apply a first control signal to the switch. A second external terminal is provided for receiving a second control signal. A fuse circuit is connected between a high potential power supply and a low potential power supply and between the first and second external terminals. For hypothetical fuse breakage, the first control signal is activated to activate the switch and by-pass the adjusted device. For actual fuse breakage, the second control signal is activated such that it has a potential greater than the first control signal so that a current flows through the fuse circuit, thereby breaking the fuse. When the fuse is broken, the switch is activated, thereby causing the adjusted device to be by-passed.

18 Claims, 4 Drawing Sheets

TRIMMING CIRCUIT

BACKGROUND OF THE INVENTION

The present invention relates to a trimming circuit, and more particularly, to a trimming circuit having a fuse that breaks electrically when adjusting the characteristics of a semiconductor integrated circuit.

During fabrication of a semiconductor integrated circuit, the electrical characteristics of the circuit are adjusted or corrected to include the circuit within a standardized range. In this process, a trimming circuit having fuses is used.

Each of the fuses is broken electrically or by a laser apparatus. A laser apparatus is normally not employed due to its relatively large size. The fuse is normally broken electrically since the fuse can easily be broken by applying a large amount of current or voltage.

In the prior art, the characteristics of a semiconductor integrated circuit subsequent to fuse breakage could not be confirmed before the fuse breakage. Thus, if the fuse is inadvertently broken, the semiconductor integrated circuit becomes defective. To prevent the fabrication of defective circuits, utmost caution is required before breaking the fuse when carrying out the breaking procedures and when testing the fuse.

Accordingly, there is a need for a trimming circuit that can easily confirm the characteristics of a semiconductor integrated circuit prior to fuse breakage. Such a trimming circuit includes an n number of polysilicon fuses (hereafter referred to a polyfuses), a transistor connected in series to each polyfuse, a control terminal for providing a control signal to each of the transistors, and trimming terminals, the number of which is two times greater than the number of polyfuses (2×n). The trimming circuit selectively deactivates the transistors and hypothetically breaks the corresponding fuses. The characteristics of the semiconductor integrated circuit when a transistor is deactivated is substantially the same as that when the fuse is actually broken. Thus, the characteristics of the semiconductor integrated circuit can be confirmed before actually breaking the fuse.

However, even if a transistor connected in series to a certain polyfuse is deactivated, a large voltage or current for breaking the other polyfuses is applied to the deactivated transistor. Thus, large transistors, which occupy a large amount of space, are required to resist high voltages or a large amount of current.

For accurate and fine adjustment of the characteristics of the semiconductor integrated circuit, the trimming circuit is provided with many polyfuses. Accordingly, the dimensions of the trimming circuit, and consequently, the chip incorporating the trimming circuit increases.

SUMMARY OF THE INVENTION

It is an object of the present invention to provide a relatively compact trimming circuit that enables hypothetical breakage of a fuse.

To achieve the above object, the present invention provides a trimming circuit for performing hypothetical fuse breakage and actual fuse breakage by selectively short-circuiting an adjusted device. The trimming circuit includes a switch circuit connected to the adjusted device for short-circuiting the adjusted device. A first external terminal is connected to the switch circuit. A first fuse circuit is connected between a first power supply and a second power supply. A second external terminal is connected to the first fuse circuit. The first fuse circuit includes a fuse connected to one of the first and second external terminals and a current limiting element connected to the other one of the first and second terminals and connected in series to the fuse. The current limiting element is connected to permit the flow of current in a forward direction from the first power supply to the second power supply. The potentials at the first and second external terminals are controlled so that the fuse is provided with a predetermined breakage current during the actual fuse breakage and the current limiting element impedes the breakage current during the hypothetical fuse breakage.

Another aspect of the present invention provides a trimming circuit for performing hypothetical fuse breakage and actual fuse breakage by selectively short-circuiting an adjusted device. The trimming circuit includes a switch circuit connected in parallel to the adjusted device and a fuse circuit including a fuse connected in series with a current limiting element. The fuse circuit is connected to the switch circuit and between a high potential power supply and a low potential power supply. The current limiting element is connected in a forward direction to permit the flow of current from the high potential power supply to the low potential power supply. A control terminal is connected to the fuse circuit and the high potential power supply. The control terminal is provided with a first control signal having a predetermined potential. A trimming terminal is connected to the fuse circuit and the switch circuit. The trimming terminal is provided with a second control signal having a predetermined potential. The potential of the second control signal is set to be less than the potential of the first control signal so that the current limiting element permits current to break the fuse during the actual breakage. The predetermined potential of the second control signal is equal to or greater than a set potential of the first control signal so that the current limiting element prevents current from breaking the fuse during the hypothetical breakage.

A further aspect of the present invention provides a trimming circuit for performing a simulated fuse breakage and an actual fuse breakage by short-circuiting a selected adjusted device. The trimming circuit includes a plurality of switch circuits. Each switch circuit is connected to an associated adjusted device. A plurality of fuse circuits are connected between a high potential power supply and a low potential power supply. Each fuse circuit is connected to an associated one of the switch circuits. The trimming circuit further includes a plurality of trimming terminals, each trimming terminal connected to a respective one of the fuse circuits and its associated switch circuit, for providing trimming signals to the fuse circuits and the switch circuits. For a simulated breakage, the trimming signals operate the respective switch circuits to selectively bypass the associated adjusted device without breaking one of the fuses circuits. A control terminal is connected to the each of the fuse circuits for providing a control signal to the fuse circuits. A selected one of the fuse circuits is broken by applying the control signal to the selected fuse circuit and simultaneously not applying the associated trimming signal to the selected fuse circuit such that a current passes through and breaks the fuse. Breaking the fuse circuit operates the switch circuit connected to the fuse circuit to bypass the associated adjusted device.

A further aspect of the present invention provides a trimming circuit having a first terminal and a second terminal. The trimming circuit includes a plurality of adjusted devices connected in series between the first and second terminals and a plurality of switch circuits. Each switch circuit is connected to an associated one of the adjusted devices. The trimming circuit further includes a plurality of fuse circuits. Each fuse circuit is connected to an associated one of the switch circuits. The trimming circuit also includes a high potential, constant-current power supply having a first output terminal and a second output terminal, the first output terminal being connected to each of the fuse circuits, and a low potential, constant-current power supply, having a plurality of first terminals and one second terminal, each first terminal being connected to an associated one of the switch circuits and the fuse circuit to which the associated switch circuit is connected, and the second terminal being connected to the second output terminal of the high potential power supply. A plurality of trimming terminals, each trimming terminal being connected to a respective one of the fuse circuits and its associated switch circuit, provides trimming signals to the fuse circuits and the switch circuits. For a simulated breakage, the trimming signals operate the respective switch circuits to selectively bypass the associated adjusted device, thereby changing the resistance between the first and second terminals without breaking one of the fuses circuits. A control terminal is connected to the each of the fuse circuits for providing a control signal to the fuse circuits. A selected one of the fuse circuits is broken by applying the control signal to the selected fuse circuit and simultaneously not applying the associated trimming signal to the selected fuse circuit so that a current passes through and breaks the fuse. Breaking the fuse circuit operates the switch circuit connected to the fuse circuit to bypass the associated adjusted device.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
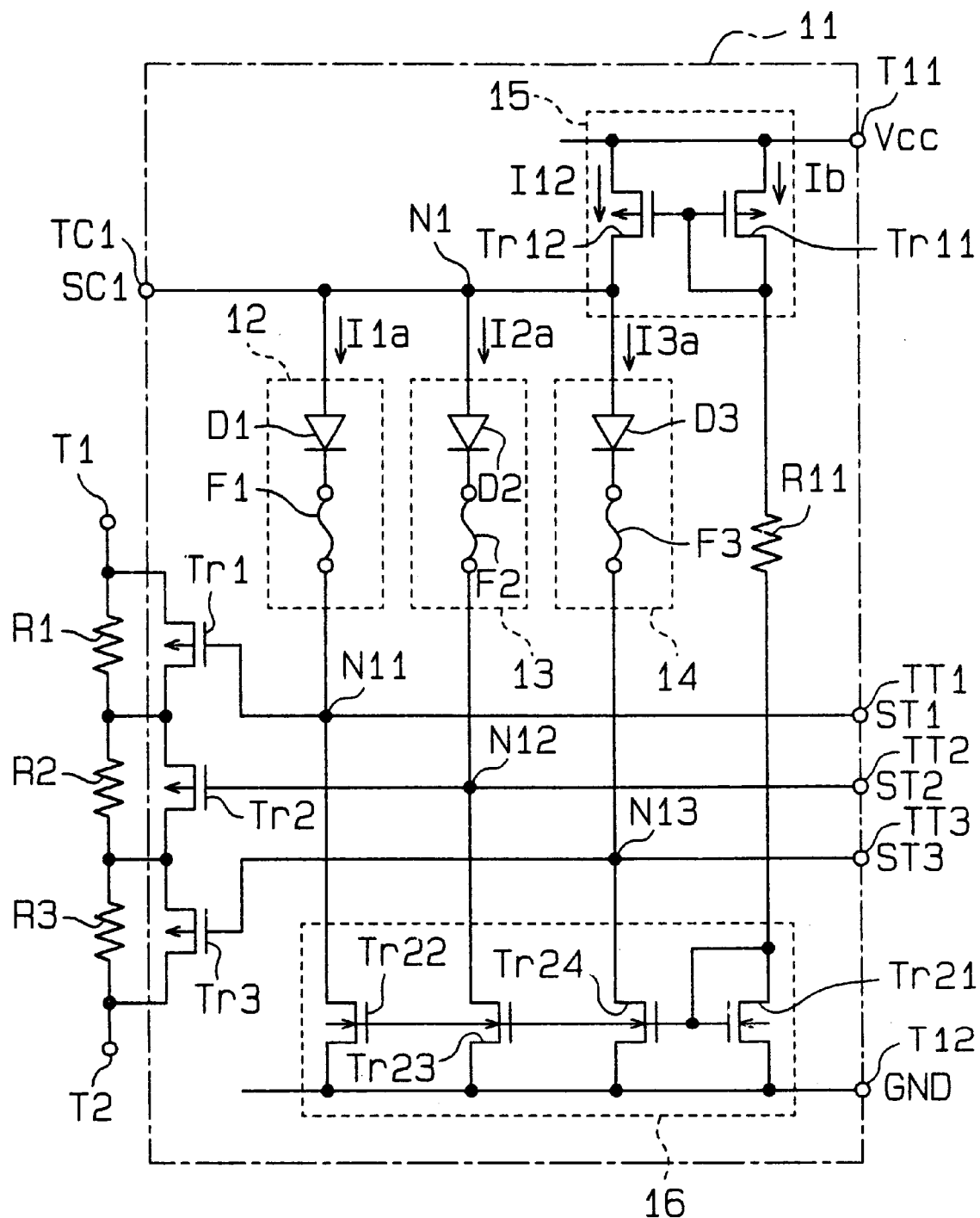
FIG. 1 is a schematic electrical circuit diagram showing a trimming circuit according to a first embodiment of the present invention.

In the drawings, like numerals are used for like elements throughout.

A trimming circuit 11 according to a first embodiment of the present invention will now be described with reference to FIG. 1.

The trimming circuit 11 adjusts the resistance between internal terminals T1, T2. Resistors R1, R2, R3, which function as adjusted devices, are connected in series between the internal terminals T1, T2. The trimming circuit 11 selectively short-circuits the resistors R1–R3 to adjust the resistance between the internal terminals T1, T2. The resistance and number of the resistors R1–R3 may be changed as required.

In correspondence with the three resistors R1–R3, the trimming circuit 11 includes three transistors Tr1, Tr2, Tr3, which function as switch circuits, and three fuse circuits 12, 13, 14.

The transistors Tr1–Tr3, which are preferably p-channel MOS transistors, are connected in parallel to the associated resistors Tr1–Tr3. The transistors Tr1–Tr3 each have a gate connected to a high potential first constant-current power supply circuit 15, via the associated fuse circuits 12–14, and a low potential second constant-current power supply circuit 16.

N-channel MOS transistors may also be employed as the transistors Tr1–Tr3. Further, the resistors R1–R3 may be connected in parallel to a combination of NMOS and PMOS transistors.

The first constant-current power supply circuit 15 is a current mirror circuit including two PMOS transistors Tr11, Tr12. The PMOS transistors Tr11, Tr12 each have a source connected to an internal terminal T11. The internal terminal T11 is connected to a high potential power supply Vcc. A gate and a drain of the first transistor Tr11 are connected to each other. The gate of the first transistor Tr11 is also connected to a gate of the second transistor Tr12. A drain of the second transistor T12 is connected to the gates of the transistors Tr1–Tr3 via the respective fuse circuits 12–14.

The drain of the first transistor Tr11 is connected to the second constant-current power supply circuit 16 via a resistor R11. This causes a bias current Ib having a predetermined value to flow through the first transistor Tr11. The second transistor Tr12 provides each of the fuse circuits 12–14 with a current greater than the bias current Ib. More specifically, the second transistor Tr12 has a capacity (electrical characteristic), which is about four times that of the first transistor Tr11, and outputs from its drain a current I12, which is four times greater than the bias current Ib. The current I12 is divided into three currents I1$a$, I2$a$, I3$a$, each being at least about 1.3 times greater than the bias current Ib, and provided to the gates of the transistors Tr1–Tr3, respectively. The current capacity of the transistor Tr12 is preferably a number or factor greater than the number of diodes. For example, since three diodes are shown in FIG. 1, the transistor Tr2 has a capacity about 4 times that of the first transistor Tr11. Thus, if more or less diodes are used, the capacity of the transistor Tr1s can be changed.

The second constant-current power supply circuit 16 is a current mirror circuit including four NMOS transistors Tr21–Tr24. The transistors Tr21–Tr24 each have a source connected to an internal terminal T12. The internal terminal T12 is connected to the ground GND (low potential power supply). A gate and a drain of the first transistor Tr21 are connected to each other. The gate of the first transistor Tr21 is also connected to the gate of each of the transistors Tr22–Tr24. The drains of the second to fourth transistors Tr22–Tr24 are each connected to the gates of the transistors Tr1–Tr2, respectively.

The second to fourth transistors Tr22–Tr24 have the same capacity (electrical characteristics) as the first transistor Tr21. The bias current Ib having a predetermined value flows through the first transistor Tr21. Accordingly, currents I1$b$, I2$b$, I3$b$ that are substantially the same as the bias current Ib flow through the second to fourth transistors Tr22–Tr24, respectively.

The fuse circuits 12, 13, 14 include diodes D1, D2, D3 and first to third polyfuses F1, F2, F3, which are connected in series with the associated diodes D1–D3, respectively. The diodes D1, D2, D3 cause the currents I1$a$–I3$a$ to flow in a forward direction in the respective fuse circuits 12–14. The diodes D1–D3 each have an anode connected to the first constant-current power supply circuit 15 and a control terminal TC1. The diodes D1–D3 each further have a cathode connected to a first terminal of the associated first to third polyfuses. The polyfuses F1–F3 each have a second terminal connected to the gate of the associated transistors Tr1–Tr3 and to respective trimming terminals TT1–TT3.

The control terminal TC1 and the trimming terminals TT1–TT3 are external terminals. The control terminal TC1 is provided with a control signal SC1. The trimming terminals TT1–TT3 are provided with control signals ST1–ST3, respectively. The trimming circuit 11 performs hypothetical fuse breakage and actual fuse breakage using the control signals SC1, ST1–ST3.

Simulated or Hypothetical Breakage

During the hypothetical breakage, the control signal SC1, which has a ground GND level, is provided to the control terminal TC1 so that current does not flow through the diodes D1–D3 in the forward direction. The control signals ST1–ST3, which have a high potential power supply Vcc level or a ground GND level, are provided to the trimming terminals TT1–TT3, respectively. The transistors Tr1–Tr3 are activated and deactivated in response to the associated control signals ST1–ST3 applied to their gates. The potential of the control signal SC1 may be changed when necessary as long as it prevents current from flowing through the diodes D1–D3 in the forward direction.

In one example, the control signal ST1 provided to the trimming terminal TT1 is low, and the control signals ST2, ST3 provided respectively to the trimming terminals TT2, TT3 are high. In response to the control signals ST1, ST2, ST3, the transistor Tr1 is activated and the transistors Tr2, Tr3 are not activated. As a result, the substantial resistance between the internal terminals T1, T2 is the synthesized resistance of the resistors R2, R3.

In this manner, the substantial resistance between the internal terminals T1, T2 is adjusted without actually breaking the polyfuses F1–F3 by applying potential at the control terminal TC1 so that current does not flow through the polyfuses F1–F3 and by controlling the potential at each of the trimming terminals TT1–TT3.

Actual Breakage

During the actual breakage, the polyfuses F1–F3 are selectively broken based on the results obtained through the hypothetical breakage.

When breaking the first polyfuse F1, a voltage or current that breaks the first polyfuse F1 is applied to the polyfuse F1. The potential between the terminals of the polyfuses F2, F3 is adjusted to a voltage that prevents current from flowing through the polyfuses F2, F3. In one example, the control signal SC1 provided to the control terminal TC1 has a high potential power supply Vcc level, the control signal ST1 provided to the trimming terminal TT1 has a ground GND level, and the control signals ST2, ST3 provided to the respective trimming terminals TT2, TT3 have a high potential power supply Vcc level.

In this example, current flows through the diode D1 in the forward direction and breaks the first polyfuse F1. Since current does not flow through the diodes D2, D3 in the forward direction, the second polyfuses F2, F3 are not broken.

In the same manner, the second polyfuse F2 or the third polyfuse F3 may be selectively broken. Further, more than one of the polyfuses F1–F3 may be selectively broken in the same manner.

In other words, current is prevented from flowing through the polyfuses F1–F3 by setting the potential at each of the trimming terminals TT1–TT3 to a value that is the same or greater than the potential at the control terminal TC1. Further, the polyfuses F1–F3 may be broken by causing the potential at the trimming terminals TT1–TT3 to be lower than the potential at the control terminal or by impeding the current supplied to the trimming terminals TT1–TT3. Accordingly, the desired polyfuse is broken without inflicting damage on the polyfuses that are not desired to be broken.

When the first polyfuse F1 is broken, the potential at the gate of the first transistor Tr1 is determined by the second constant-current power supply circuit 16. That is, the current I1b flows from the gate of the first transistor Tr1 to the transistor Tr22. This decreases the gate potential at the first transistor Tr1 to the ground GND level and activates the first transistor Tr1.

Since the polyfuses F2, F3 are not broken, the potentials at the gates of the second and third transistors Tr2, Tr3 are determined in accordance with the capacity balance between the first and second constant-current power supply circuits 15, 16. That is, the current I12, which is four times greater than the bias circuit Ib, is output from the first constant-current power supply circuit 15 and divided to the second and third fuse circuits 13, 14. Accordingly, the gates of the second and third transistors Tr2, Tr3 are supplied with the currents I2a, I3a, which are two times greater than the bias current Ib. The currents I2b, I3b that flow from the gates of the associated second and third transistors Tr2, Tr3 to the second constant-current power supply circuit 16 have the same level as the bias current Ib. The difference between the values of the supplied currents I2a, I3a and the discharge currents I2b, I3b pulls up the potentials at the gates of the second and third transistors Tr2, Tr3 to the high potential power supply Vcc level and deactivates the transistors Tr2, Tr3.

In this manner, the broken first polyfuse F1 short-circuits the resistor R1. This changes the effective resistance between the internal terminals T1, T2.

The advantages of the first embodiment will now be discussed.

(1) Hypothetical breakage and actual breakage of the three polyfuses F1–F3 are performed by controlling the potentials at the three trimming terminals TT1–TT3 and the control terminal TC1. To control an n number of transistors (switch circuits), an n number of polyfuses are hypothetically or actually broken by an n+1 number of external terminals, which is fewer than in the prior art. Accordingly, the circuit area of the semiconductor device is reduced.

(2) The current for breaking the polyfuses F1–F3 does not flow through the first and second constant-current power supply circuits 15, 16. Thus, low current transistors can be used as the transistors Tr12, Tr22–Tr24 of the first and second constant-current power supply circuits 15, 16. Further, relatively low currents can be used as the currents I12, I1b–I3b. Accordingly, the circuit area of the semiconductor device is reduced.

Figure 2:
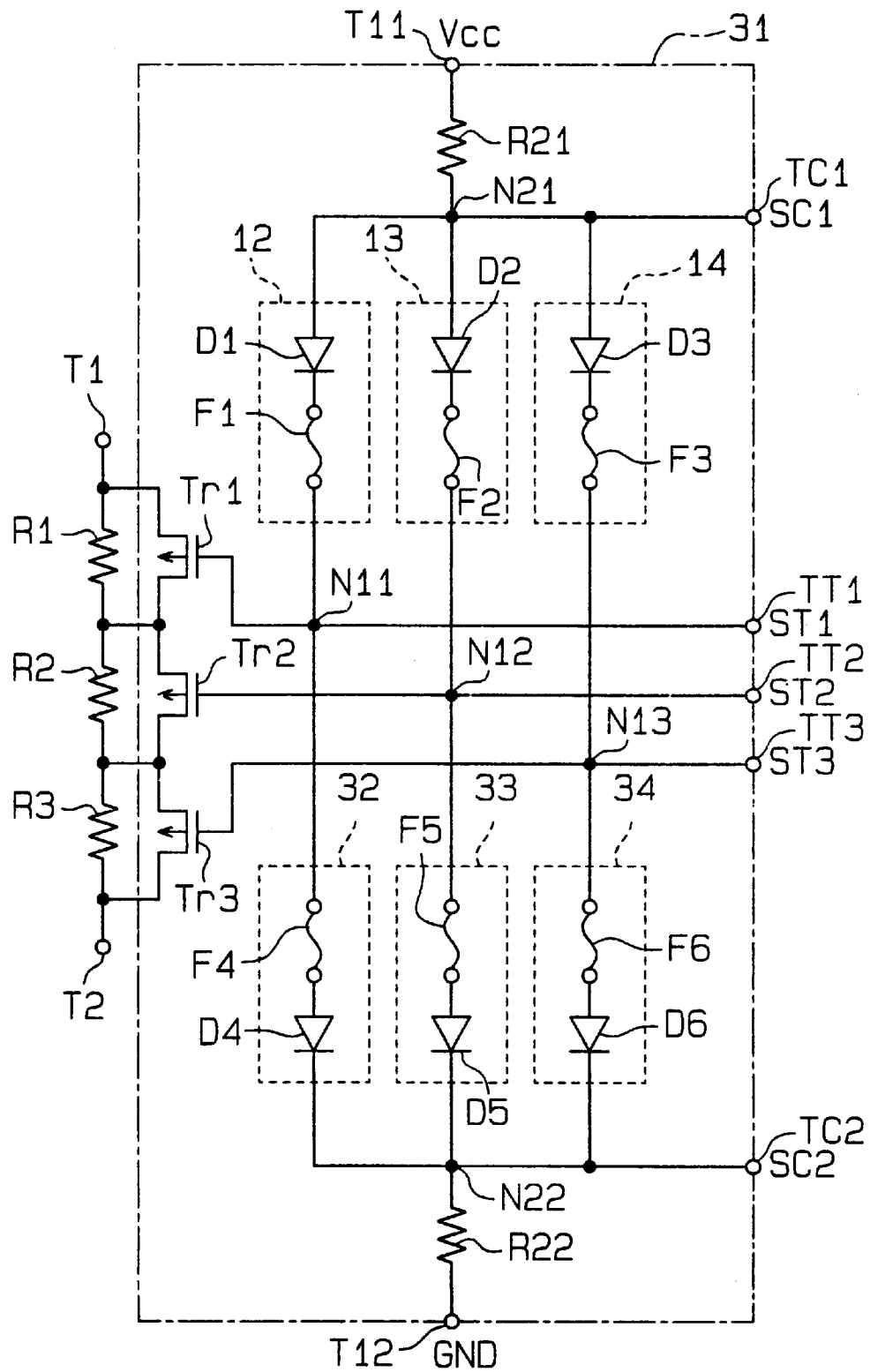
FIG. 2 is a schematic electrical diagram showing a trimming circuit according to a second embodiment of the present invention.

A trimming circuit 31 according to a second embodiment of the present invention will now be described with reference to FIG. 2.

The trimming circuit 31 includes transistors Tr1–Tr3 and six fuse circuits 12–14 and 32–34. The first to third fuse circuits 12–14 are connected between the gates of the associated transistors Tr1–Tr3 and an internal terminal T11.

The internal terminal T11 is connected to the high potential power supply Vcc. The fourth to sixth fuse circuits 32–34 are connected between the gates of the associated transistors Tr1, Tr2, Tr3 and an internal terminal T12. The internal terminal T12 is connected to a low potential power supply (ground GND).

A node N11 between the first and fourth fuse circuits 12, 32 is connected to the gate of the first transistor Tr1. A node N12 between the second and fifth fuse circuits 13, 33 is connected to the gate of the second transistor Tr2. A node N13 between the third and sixth fuse circuits 14, 34 is connected to the gate of the third transistor Tr3.

The fuse circuits 12–14, 32–34 respectively include diodes D1–D3, D4–D6 and polyfuses F1–F3, F4–F6, which are connected in series to the associated diodes D1–D3, D4–D6. The diodes D1–D3 are connected so that current flows from the internal terminal T11 toward the gates of the transistors Tr1–Tr3. The diodes D4–D6 are connected so that current flows from the gates of the transistors Tr1–Tr3 to the internal terminal T12. That is, the anodes of the first to third diodes D1–D3 are connected to the internal terminal T11, and the cathodes of the fourth to sixth diodes D4–D6 are connected to the internal terminal T12. The arrangements of the diodes D1–D3 and the associated polyfuses F1–F3 and the arrangements of the polyfuses F4–F6 and the diodes D4–D6 may be reversed.

The first to third fuse circuits 12–14 are connected to a node N21. A resistor R21 is connected between the node N21 and the internal terminal T11. The fourth to sixth fuse circuits 32–34 are connected to a node N22. A resistor R22 is connected between the node N22 and the internal terminal T12.

The node N21 is connected to the first control terminal TC1, and the node N22 is connected to the control terminal TC2. The nodes N11–N13 are connected to first to third trimming terminals TT1–TT3, respectively.

The control terminals TC1, TC2 are provided with control signals ST1, ST2, each having a potential or a current for performing hypothetical and actual fuse breakage. The trimming terminals TT1–TT3 are provided with control signals ST1–ST3, each having a potential or a current for performing hypothetical and actual fuse breakage.

Hypothetical Breakage

During the hypothetical breakage, the control signal SC1, which has a ground GND level, is provided to the control terminal TC1, and the control signal SC2, which has a high potential power supply Vcc level is provided to the second control terminal TC2. The control signals ST1–ST3, which have a high potential power supply Vcc level or a ground GND level, are provided to the trimming terminals TT1–TT3, respectively.

The potentials applied to each of the terminals TC1, TC2, TT1–TT3 are set so as to satisfy the relationship of, the potential at the second control terminal TC2 (control signal SC2)≧the potentials at the trimming terminals TT1–TT3≧the potential at the first control terminal TC1 (control signal SC1).

The relationship prevents current from flowing through the diodes D1–D3, D4–D6 in the forward direction. The transistors Tr1–Tr3 are activated and deactivated in response to the associated control signals ST1–ST3.

In one example of hypothetical breakage, the control signal ST1 provided to the trimming terminal TT1 is low, and the control signals ST2, ST3 provided to the respective trimming circuits TT2, TT3 are high. As a result, the transistor Tr1 is activated and the transistors Tr2, Tr3 are deactivated. Thus, the substantial resistance between the internal terminals T1, T2 is the synthesized resistance of the resistors R2, R3.

In this manner, the substantial resistance between the internal terminals T1, T2 may be adjusted to a certain value by controlling the potentials at the trimming terminals TT1–TT3, while setting the potentials at the control terminals TC1–TC2 so that current does not flow through the polyfuses F1–F6. This enables the resistance between the internal terminals T1, T2 for optimally driving the semiconductor device to be checked.

Actual Breakage

During the actual breakage, the polyfuses F1–F3 are selectively broken based on the results obtained through the hypothetical breakage.

When breaking the first polyfuse F1, a voltage or current that breaks the first polyfuse F1 is applied to the polyfuse F1. In this state, potentials having a level that prevents current from flowing through the second and third polyfuses F2, F3 are applied to the second and third polyfuses F2, F3. In one example, the control signals SC1, SC2 provided to the associated first and second control terminals TC1, TC2 have a high potential power supply Vcc level. The control signal ST1 provided to the first trimming terminal TT1 has a ground GND level, and the control signals ST2, ST3 provided to the second and third trimming terminals TT2, TT3 have a high potential power supply Vcc level.

This results in current flowing through the diode D1 in the forward direction, which breaks the first polyfuse. Since current does not flow through the diodes D2–D6 in the forward direction, the polyfuses F2–F6 are not broken.

In the same manner, the second polyfuse F2 and the third polyfuse F3 may be selectively broken. Further, more than one of the polyfuses F1–F6 may be selectively broken in the same manner.

In other words, current is prevented from flowing through the polyfuses F1–F6 by setting the potential at each of the trimming terminals TT1–TT3 to a value that is the same or greater than the potential at the first and second control terminals TC1, TC2. Further, the polyfuses F1–F6 may be broken by causing the potentials at the trimming terminals TT1–TT3 to be lower than the potentials at the control terminals TC1, TC2 or by impeding the current supplied to the trimming terminals TT1–TT3. Accordingly, the desired polyfuse is broken without inflicting damage on the polyfuses that are not intended to be broken.

Then, the polyfuses F4–F6 arranged at the ground GND side are selectively broken based on the results obtained through the hypothetical breakage.

When breaking the polyfuses F5, F6, a potential or current that breaks the polyfuses F5, F6 is applied to the polyfuses F5, F6, while a potential that prevents current from flowing through the polyfuse F4 is applied to the polyfuse F4.

In one example, the control signals SC1, SC2 provided to the respective control terminals TC1, TC2 have a ground GND level. The control signal ST1 provided to the trimming terminal TT1 has a ground GND level, and the control signals ST2, ST3 provided to the respective trimming terminals TT2, TT3 have a high potential power supply Vcc level. This results in current flowing through the diodes D5, D6 in the forward direction and breaks the fifth and sixth polyfuses F5, F6. Since current does not flow through the diodes D1–D4 in the forward direction, the second polyfuses F1–F4 are not broken.

In other words, current is prevented from flowing through the polyfuses F1–F6 by setting the potential at each of the trimming terminals TT1–TT3 to a value that is the same or greater than the potential at the first and second control terminals TC1, TC2. Further, the polyfuses F1–F3 may be broken by causing the potential at the trimming terminals TT1–TT3 to be higher than the potential at the control terminals TC1, TC2 or by supplying current to the trimming terminals TT1–TT3. Accordingly, the desired polyfuse is broken without inflicting damage on the polyfuses not intended to be broken.

By breaking the first polyfuse F1, the potential at the gate of the first transistor Tr1 is set at the ground GND level and the transistor Tr1 is activated. By breaking the polyfuses F5, F6, the potential at the gates of the second and third transistors Tr2, Tr3 is set at the high potential power supply Vcc level and the transistors Tr2, Tr3 are deactivated.

The broken first polyfuse F1 short-circuits the resistor R1. This changes the effective resistance between the internal terminals T1, T2.

The first and fourth polyfuses F1, F4, the second and fifth polyfuses F2, F5, and the third and sixth polyfuses F3, F6 are broken or left unbroken in a complementary manner. Accordingly, current does not flow directly between the internal terminals T11 and T12.

The advantages of the second embodiment will now be discussed.

(1) Hypothetical breakage of the six polyfuses F1–F6 are performed by controlling the potentials at the three trimming terminals TT1–TT3 and the two control terminals TC1, TC2. That is, two polyfuses for each transistor (switch circuit) are hypothetically and actually broken using an n+2 number of external terminals (n being the number of transistors), which is fewer than in the prior art. Accordingly, the dimensions of the trimming circuit 11 and the semiconductor device incorporating the trimming circuit 11 are reduced.

(2) Since the polyfuses F1–F3 at the high power supply Vcc side and the respective polyfuses F4–F6 at the ground GND side are broken in a complementary manner, current does not flow from the high potential power supply Vcc to the ground GND after the actual breakage. This reduces the current consumed by the semiconductor device incorporating the trimming circuit 31.

It should be apparent to those skilled in the art that the present invention may be embodied in many other specific forms without departing from the spirit or scope of the invention. Particularly, it should be understood that the present invention may be embodied in the following forms.

In each of the above embodiments, the number of resistors R1–R3 connected between the internal terminals T1, T2 may be changed as required.

In each of the above embodiments, the combination of the potentials supplied to the internal terminals T11, T12 may be, for example, the high potential power supply Vcc and the low potential power supply Vss or the low potential power supply Vss and the ground GND. In this case, the potentials of the signals ST1–ST3, SC1, SC2 provided to the corresponding trimming terminals TT1–TT3 and the control terminals TC1, TC2 are adjusted in accordance to the potential at the internal terminals T11, T12.

In the first embodiment, the arrangement of the polyfuses and diodes connected to the first and second constant-current power supply circuits 15, 16 and the circuit configuration may be changed as described below.

Figure 3:
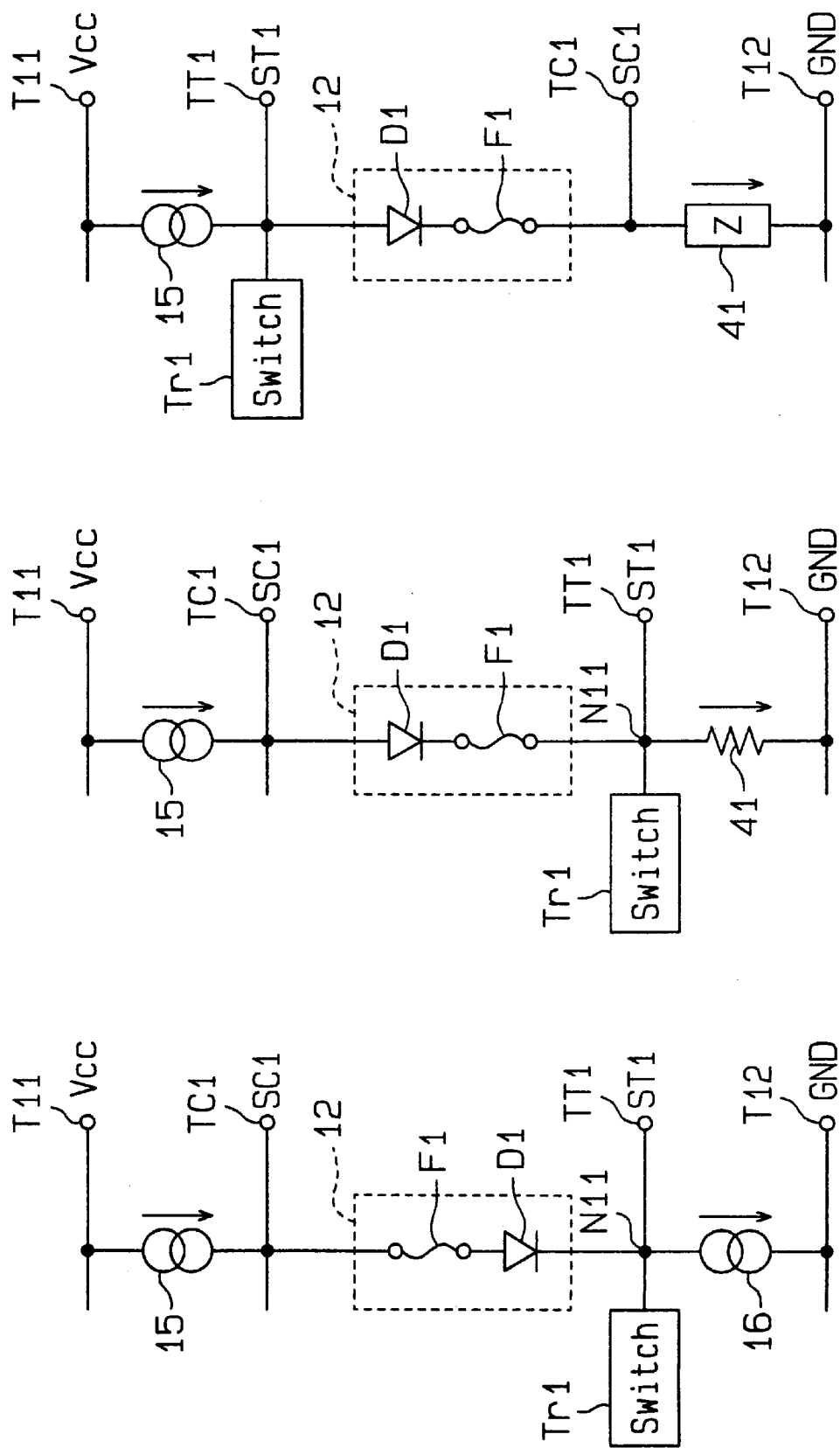
FIGS. 3A–3C are schematic partial electrical circuit diagrams showing a trimming circuit according to further embodiments of the present invention.

In the example shown in FIG. 3A, the first polyfuse F1 has a first terminal connected to the constant-current power supply circuit 15 and a second terminal connected to the anode of the diode D1. The cathode of the diode D1 is connected to the transistor Tr1.

In the example shown in FIG. 3B, an impedance device (resistor) 41 is connected between the trimming terminal TT1 and the internal terminal T12 in lieu of the second constant-current power supply circuit 16. Although not shown in the drawing, an impedance device may also be used instead of the first constant-current power supply circuit 15. As another option, the constant-current power supply circuits 15, 16 may be replaced by impedance devices.

In the example shown in FIG. 3C, the fuse circuit 12 is connected between the transistor Tr1, which functions as a switch circuit, and the internal terminal T12.

Figure 4:
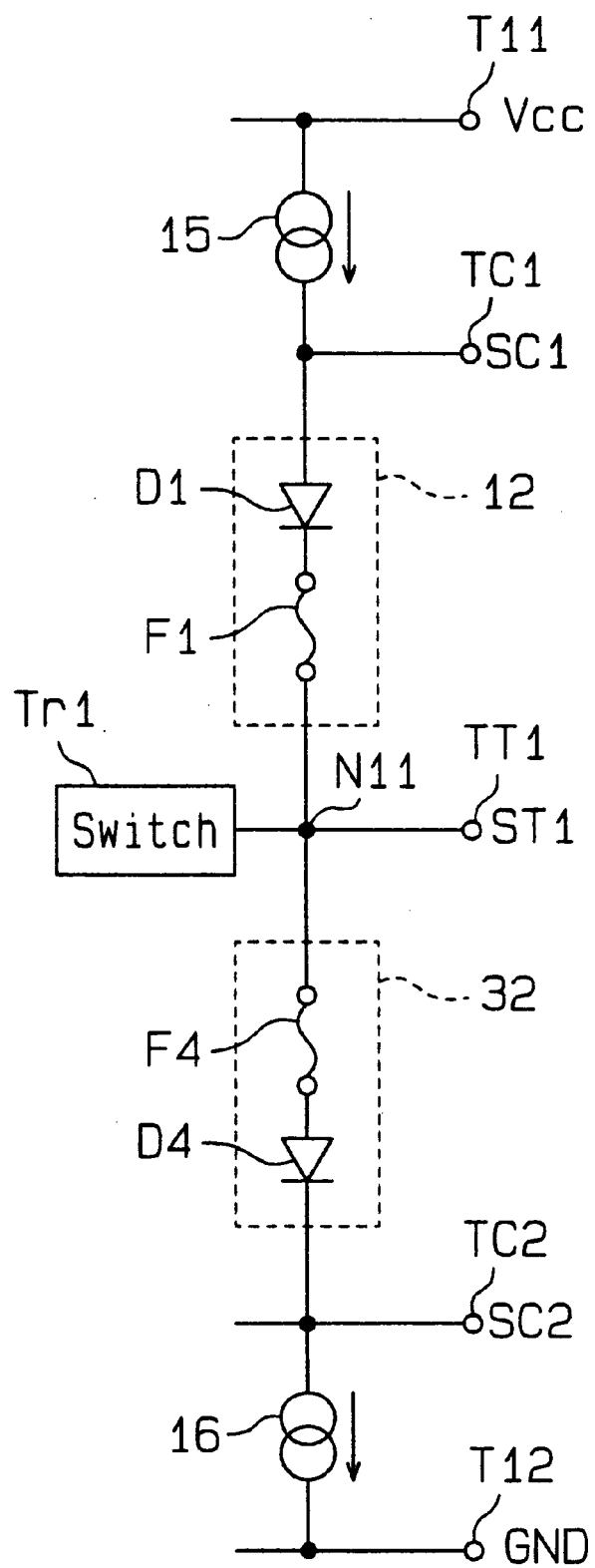
FIG. 4 is a schematic partial electrical circuit diagram showing a trimming circuit according to another embodiment of the present invention.

With reference to FIG. 4, in a further embodiment according to the present invention, instead of connecting the resistors R21, R22 to the internal terminals T11, T12 like in the second embodiment, first and second constant-current power supply circuits 15, 16 may be connected to the internal terminals T11, T12, respectively.

In each of the above embodiment, the resistors R1–R3, which function as adjusted devices, may be connected in parallel with transistors Tr1–Tr3, which function as switch circuits, connected thereto, respectively. This also allows the trimming circuits 11, 31 to adjust the effective resistance between the internal terminals T1, T2.

In each of the above embodiments, pn junction devices and Schottky junction devices may be used in lieu of the diodes D1–D6 as a current limiting element. Thus, the use of the term current limiting element is meant to include diodes, pn junction devices and Schottky devices.

The present examples and embodiments are to be considered as illustrative and not restrictive, and the invention is not to be limited to the details given herein, but may be modified within the scope and equivalence of the appended claims.

What is claimed is:

1. A trimming circuit for performing hypothetical fuse breakage and actual fuse breakage by selectively short-circuiting an adjusted device, the trimming circuit comprising:
   a switch circuit connected to the adjusted device for short-circuiting the adjusted device;
   a first external terminal connected to the switch circuit;
   a first fuse circuit connected between a first power supply and a second power supply; and
   a second external terminal connected to the first fuse circuit, wherein the first fuse circuit includes;
      a fuse connected to one of the first and second external terminals; and
      a current limiting element connected to the other one of the first and second terminals and connected in series to the fuse, wherein the current limiting element is connected to permit the flow of current in a forward direction from the first power supply to the second power supply, and wherein the potentials at the first and second external terminals are controlled so that the fuse is provided with a predetermined breakage current during the actual fuse breakage and the current limiting element impedes the breakage current during the hypothetical fuse breakage.

2. The trimming circuit according to claim 1, wherein the first external terminal includes a trimming terminal connected to the switch circuit, the trimming terminal selectively providing the switch circuit with a trimming signal for activating the switch circuit, and wherein the second external terminal includes a control terminal connected to the current limiting element, the control terminal selectively providing the current limiting element with a control signal having a potential for setting the current limiting element in a high impedance state.

3. The trimming circuit according to claim 2, wherein the first power supply is a high potential power supply and the second power supply is a low potential power supply, the trimming circuit further comprising:
   a first constant-current power supply circuit for providing the switch circuit with current from the high potential power supply;
   a second constant-current power supply circuit for permitting the flow of current from the switch circuit to the low potential power supply, wherein the first fuse circuit is connected between the switch circuit and at least one of the first and second constant-current power supply circuits, and wherein the control terminal is connected between the first fuse circuit and at least one of the first and the second constant-current power supply circuits.

4. The trimming circuit according to claim 2, further comprising:
   a first impedance device connected between the first power supply and the switch circuit;
   at least one of a constant-current power supply and a second impedance device connected between the second power supply and the switch circuit; and
   a second fuse circuit connected between the second impedance device or the constant-current power supply and the switch circuit.

5. The trimming circuit according to claim 2, wherein the adjusted device, the switch circuit, the fuse circuit, and the trimming terminal are each provided in pluralities, the plurality of the fuse circuits being connected between the control terminal and the plurality of the switch circuits, and wherein the potentials at the control terminal and each of the trimming terminals are controlled so that the current limiting element corresponding to a fuse that is not to be broken enters a high impedance state and so that the current limiting element corresponding to the fuse that is to be broken permits the flow of current therethrough in the forward direction.

6. The trimming circuit according to claim 2, further comprising:
   a first impedance device connected between the first power supply and the first fuse circuit;
   a second impedance device connected to the second power supply; and
   a second fuse circuit connected between the second impedance device and the switch circuit.

7. A trimming circuit for performing hypothetical fuse breakage and actual fuse breakage by selectively short-circuiting an adjusted device, the trimming circuit comprising:
   a switch circuit connected in parallel to the adjusted device;
   a fuse circuit including a fuse connected in series with a current limiting element, wherein the fuse circuit is connected to the switch circuit and between a high potential power supply and a low potential power supply, and wherein the current limiting element is connected in a forward direction to permit the flow of current from the high potential power supply to the low potential power supply;
   a control terminal connected to the fuse circuit and the high potential power supply, wherein the control terminal is provided with a first control signal having a predetermined potential; and
   a trimming terminal connected to the fuse circuit and the switch circuit, wherein the trimming terminal is provided with a second control signal having a predetermined potential, wherein the potential of the second control signal is set to be less than the potential of the first control signal so that the current limiting element permits current to break the fuse during the actual breakage, and wherein the predetermined potential of the second control signal is equal to or greater than a set potential of the first control signal so that the current limiting element prevents current from breaking the fuse during the hypothetical breakage.

8. The trimming circuit according to claim 7, wherein the switch circuit is a MOS transistor.

9. A trimming circuit for performing a simulated fuse breakage and an actual fuse breakage by short-circuiting a selected adjusted device, the trimming circuit comprising:
   a plurality of switch circuits, each switch circuit connected to an associated adjusted device;
   a plurality of fuse circuits connected between a high potential power supply and a low potential power supply, and wherein each fuse circuit is connected to an associated one of the switch circuits;
   a plurality of trimming terminals, each trimming terminal connected to a respective one of the fuse circuits and its associated switch circuit, for providing trimming signals to the fuse circuits and the switch circuits, wherein for a simulated breakage, the trimming signals operate the respective switch circuits to selectively bypass the associated adjusted device without breaking one of the fuses circuits; and
   a control terminal connected to the each of the fuse circuits for providing a control signal to the fuse circuits, wherein a selected one of the fuse circuits is broken by applying the control signal to the selected fuse circuit and simultaneously not applying the associated trimming signal to the selected fuse circuit such that a current passes through and breaks the fuse, whereby breaking the fuse circuit operates the switch circuit connected to the fuse circuit to bypass the associated adjusted device.

10. A trimming circuit having a first terminal and a second terminal, comprising:
   a plurality of adjusted devices connected in series between the first and second terminals;
   a plurality of switch circuits, each switch circuit connected to an associated one of the adjusted devices;
   a plurality of fuse circuits, each fuse circuit connected to an associated one of the switch circuits;
   a high potential, constant-current power supply having a first output terminal and a second output terminal, wherein the first output terminal is connected to each of the fuse circuits;
   a low potential, constant-current power supply, having a plurality of first terminals and one second terminal, wherein each first terminal is connected to an associated one of the switch circuits and the fuse circuit to which the associated switch circuit is connected, and the second terminal is connected to the second output terminal of the high potential power supply;
   a plurality of trimming terminals, each trimming terminal connected to a respective one of the fuse circuits and its associated switch circuit, for providing trimming signals to the fuse circuits and the switch circuits, wherein for a simulated breakage, the trimming signals operate the respective switch circuits to selectively bypass the associated adjusted device, thereby changing the resistance between the first and second terminals without breaking one of the fuses circuits; and a control terminal connected to the each of the fuse circuits for providing a control signal to the fuse circuits, wherein a selected one of the fuse circuits is broken by applying the control signal to the selected fuse circuit and simultaneously not applying the associated trimming signal to the selected fuse circuit so that a current passes through and breaks the fuse, whereby breaking the fuse circuit operates the switch circuit connected to the fuse circuit to bypass the associated adjusted device.

11. The trimming circuit according to claim 10, wherein the high potential power supply comprises a current mirror circuit having a first transistor and a second transistor, wherein the sources of the first and second transistors are connected to a high potential, the gate of the first transistor is connected to its source and to the gate of the second transistor, the drain of the second transistor is connected to the plurality of fuse circuits by way of the first terminal, and the drain of the first transistor is connected to the low potential power supply by way of the second terminal, such that a bias current flows through the first transistor, and the second transistor provides each of the fuse circuits with a current greater than the bias current.

12. The trimming circuit according to claim 11, wherein the second transistor has a capacity greater than a capacity of the first transistor, wherein the capacity is related to the number of the fuse circuits.

13. The trimming circuit according to claim 12, wherein the drain current of the second transistor is greater than the bias current by an amount related to the number of the fuse circuits.

14. The trimming circuit according to claim 12, further comprising a resistor connected between the drain of the first transistor of the high potential power supply and the low potential power supply.

15. The trimming circuit according to claim 11, wherein the low potential power supply comprises a current mirror circuit including a third transistor and a plurality of fourth transistors, wherein each of the third and the fourth transistors has a source connected to a low potential, the third transistor has its gate and its drain connected together and to the gates of each of the fourth transistors, the drains of each of the fourth transistors are connected to the fuse circuits by way of the low potential power supply first terminals, and the drain of the third transistor is connected to the high potential power supply by way of the one second terminal of the low potential power supply.

16. The trimming circuit according to claim 10, wherein the adjusted devices comprise resistors.

17. The trimming circuit according to claim 10, wherein the plurality of switch circuits comprises a plurality of transistors connected in parallel with the adjusted devices.

18. The trimming circuit according to claim 10, wherein the fuse circuits each comprise a diode connected in series with a polyfuse.

* * * * *